(12) United States Patent
Casady et al.

(10) Patent No.: US 7,009,209 B2
(45) Date of Patent: Mar. 7, 2006

(54) SILICON CARBIDE AND RELATED WIDE-BANDGAP TRANSISTORS ON SEMI-INSULATING EPITAXY FOR HIGH-SPEED, HIGH-POWER APPLICATIONS

(75) Inventors: Jeffrey B. Casady, Starkville, MS (US); Michael Mazzola, Starkville, MS (US)

(73) Assignee: Mississippi State University Research and Technology Corporation (RTC), Mississippi State, MS (US)

( * ) Notice: Subject to any disclaimer, the term of this patent is extended or adjusted under 35 U.S.C. 154(b) by 0 days.

(21) Appl. No.: 10/033,785

(22) Filed: Jan. 3, 2002

(65) Prior Publication Data

US 2002/0149021 A1   Oct. 17, 2002

Related U.S. Application Data

(60) Provisional application No. 60/259,207, filed on Jan. 3, 2001.

(51) Int. Cl.
*H01L 31/0312*   (2006.01)

(52) U.S. Cl. .................. 257/77; 257/194; 257/103; 257/78; 257/256; 257/195; 257/369; 438/105; 438/931; 437/100

(58) Field of Classification Search .......... 257/77, 257/E29.104, 194, 103, 78, 256, 195, 368; 437/100; 438/931, 105
See application file for complete search history.

(56) References Cited

U.S. PATENT DOCUMENTS

| | | | |
|---|---|---|---|
| 4,794,608 A | * | 12/1988 | Fujita et al. ................ 372/50 |
| 5,138,401 A | | 8/1992 | Yamazaki |
| 5,270,554 A | | 12/1993 | Palmour |
| 5,597,744 A | * | 1/1997 | Kamiyama et al. ......... 438/285 |
| 5,611,955 A | * | 3/1997 | Barrett et al. ............ 252/62.3 C |
| 5,967,794 A | * | 10/1999 | Kodama .................... 438/300 |
| 6,218,680 B1 | | 4/2001 | Carter et al. |
| 6,303,508 B1 | * | 10/2001 | Alok ........................ 438/705 |
| 6,310,385 B1 | * | 10/2001 | Ajit .......................... 257/524 |
| 6,410,396 B1 | | 6/2002 | Casady et al. |

OTHER PUBLICATIONS

Trivedi, M., et al., "Comparison of RF Performance of Vertical and Lateral DMOSFET", IEEE Int'l Symposium on Power Semiconductor Devices and ICs, p. 245-248, May 1999.

Mazzola, M.S., et al., "Close Compensation of 6H and 4H Silicon Carbide By Silicon-to-Carbon Ratio Control", Materials Science and Engineering, pp. 155-157, 1999.

(Continued)

*Primary Examiner*—Steven Loke
*Assistant Examiner*—Junghwa Im
(74) *Attorney, Agent, or Firm*—DLA Piper Rudnick

(57) ABSTRACT

A silicon carbide semi-insulating epitaxy layer is used to create power devices and integrated circuits having significant performance advantages over conventional devices. A silicon carbide semi-insulating layer is formed on a substrate, such as a conducting substrate, and one or more semiconducting devices are formed on the silicon carbide semi-insulating layer. The silicon carbide semi-insulating layer, which includes, for example, 4H or 6H silicon carbide, is formed using a compensating material, the compensating material being selected depending on preferred characteristics for the semi-insulating layer. The compensating material includes, for example, boron, vanadium, chromium, or germanium. Use of a silicon carbide semi-insulating layer provides insulating advantages and improved thermal performance for high power and high frequency semiconductor applications.

34 Claims, 3 Drawing Sheets

OTHER PUBLICATIONS

Mazzola, M.S., et al., "Boron Compensation of 6H Silicon Carbide", Materials Science Forum, vols. 264-268, pp. 119-122, 1998.

Hiraoka, Y., et al., "Comparison of High-Frequency Performance of Quasi-SOI and Conventional SOI Power MOSFETs", 2000 International Symposium on Power Semiconductor Devices and IC's, p. 161-164, May 22-25, 2000.

Ludikhuize, A.W., "A Review of RESURF Technology", 2000 International Symposium on Power Semiconductor Devices and IC's, p. 11-18, May 22-25, 2000.

Tan, Y., et al., "A SOI LDMOS/CMOS/BJT Technology for Fully-Integrated RF Power Amplifiers", 2000 International Symposium on Power Semiconductor Devices and IC's, p. 137-140, May 22-25, 2000.

Spitz, J., et al., "High-Voltage (2.6 kV) Lateral DMOSFETs in 4H-SiC", Materials Science Forum, vols. 264-268, pp. 1005-1008, 1998.

* cited by examiner

SILICON CARBIDE AND RELATED WIDE-BANDGAP TRANSISTORS ON SEMI-INSULATING EPITAXY FOR HIGH-SPEED, HIGH-POWER APPLICATIONS

This application claims priority from U.S. Provisional Patent Application Ser. No. 60/259,207 filed Jan. 3, 2001. The entirety of that provisional application is incorporated herein by reference.

This invention was made with U.S. Government support under contract No. N00014-99-1-1103 awarded by the Office of Naval Research. The Government may have certain rights in this invention.

BACKGROUND OF THE INVENTION

1. Field of the Invention

This invention relates to advanced microelectronic (semiconductor) devices and methods for fabricating the same, and in particular, to microelectronic devices employing a semi-insulating layer over a substrate.

2. Background of the Technology

Silicon carbide (SiC) is a rapidly maturing semiconductor technology that has excellent thermal conductivity and high breakdown strength. Wide bandgap materials, such as SiC and gallium nitride (GaN), have recently received significant attention for high frequency applications and other applications, including high-speed, high-power applications, such as compact, efficient radar transmitters in airborne and ground-based radar systems, as well as power integrated circuits and commercial power switching applications, such as compact fluorescent and high intensity discharge ballasts and compact battery charging systems for portable electronics. However, fundamental issues associated with substrate growth, doping, device processing, and long-term device reliability may limit their ultimate practicality. For example, a lateral structure is often selected because of its potential application in power integrated circuits, lower theoretical on-resistance than conventional vertical devices, and because of preliminary indications that lateral metal-oxide-semiconductor field effect transistors (LMOSFETs) have better radio frequency (RF) performance than vertical metal-oxide-semiconductor field effect transistors (MOSFETs). (See, e.g., M. Trivedi and K. Shenai, "The Comparison of RF Performance of Vertical and Lateral DMOSFET," *IEEE Int'l Symposium on Power Semiconductor Devices and ICs*, p. 245 (May 1999), which is hereby incorporated by reference).

SUMMARY OF THE INVENTION

It is an advantage of the present invention to use lower-cost, conducting SiC substrates, while retaining device performance advantages gained from the semi-insulating (SI) layer.

It is also an advantage of the present invention to isolate active areas of devices, such as high-frequency metal semiconductor field effect transistors (MESFETs), from the substrate, thereby providing for a less defective and higher-performance active device.

It is yet another advantage of the present invention to provide an electrically insulating, but thermally conductive, layer that is able to reduce device leakage, increase performance, and provide isolation of devices to allow higher levels of integration.

With the present invention, the microelectronic device is improved to include a buffer (such as SiC SI epitaxy, preferably transition metal-doped or deep-level compensated) over a substrate that is preferably a conducting wide bandgap material. This improvement allows for the use of conducting, low-cost, high-quality n-type substrates, while retaining the benefits of semi-insulating material. Because of higher volume, fewer defects, and larger diameters, the n-type conducting substrates have the advantage of low cost, while being among the highest quality SiC substrates available. This device structure also allows for breakdown optimization and lends itself more readily to an integrated chip (IC) fabrication process. Similar structures are achieved in silicon, but using buried oxide layers via ion implantation. This is not feasible in SiC with current implant technology. The fact that SiC is a wide bandgap material and has deep-level defects allows a buried insulator to be placed in the device using an SI epitaxy structure. Finally, the SI epitaxy is a less defective layer than the substrate, so high-frequency devices such as SiC or GaN field effect transistors (FETs) can utilize the buffer layer on either conducting or SI substrates to reduce the defect density under the channel and improve reliability through reduction or elimination of the back-gating effect.

Additional advantages and features of the present invention will be set forth in part in the detailed description that follows and in part will become more apparent to those skilled in the art upon examination of the following or upon learning by practice of the invention.

DETAILED DESCRIPTION

The present invention provides for a silicon carbide semi-insulating (SI) epitaxy layer used to create an entire class of power devices and integrated circuits with significant performance advantages over conventional devices. This technology is analogous to the commercially available Silicon-on-Insulator (SOI) structure, but provides advantages over the existing SOI structure, including homoepitaxy, which improves thermal conductivity and dissipation over the existing SOI structure, which is typically an insulator having significantly different thermal conductivity characteristics from the SiC based substrate upon which the structure is formed.

A requirement for electrical isolation between devices made on conducting substrates is that the epitaxial film be both thick enough and resistive enough. In general, the epitaxial film must be thicker than several diffusion lengths to ensure that carriers injected from the top by the device or from the bottom by the conducting substrate are trapped and, therefore, will not diffuse through the insulating layer. The thickness of the epitaxial film is determined based on a selected leakage current for a given voltage used. The leakage current varies as a function of $V^2/L^3$, where L is the thickness of the epitaxial film and V is the voltage applied. Because the deep traps that make a semiconductor material become semi-insulating also "kill" (i.e., severely reduce) the minority carrier lifetime, the actual diffusion length in the SI epitaxy layer is short (<0.5 μm), and, therefore, a 10–15 μm thick epitaxy layer should be sufficient. Leakage currents through the epitaxy layer are then determined by the larger of the Ohmic current or the space charge limited (SCL) current. For SI material, the SCL current is negligible until the voltage threshold for trap filling is reached, which can be as much as 350 V for 10 μm semi-insulating films. See, e.g., N. Goto et al., "Two-Dimensional Numerical Simulation of Side-Gating Effect in GaAs MESFETs," *IEEE Trans. Electron Dev.*, 37:1821–1827 (1990), which is hereby incorporated by reference.

Thicker films have correspondingly larger trap filling threshold voltages. For example, if the collector of the vertical transistor 29 in FIG. 2 (described further below) is operated at 600 V with respect to the conducting substrate, then a 20 μm SI epitaxy film is capable of preventing all but Ohmic leakage currents to the substrate. Given the very large resistivities of SI SiC (>$10^{12}$ Ω-cm), the Ohmic leakage current would be less than 1 nA (i.e., negligibly small). Monolithic circuits can be made, therefore, on SiC SI isolated substrates using high-power-density vertical SiC power devices that are both much smaller and more thermally stable than silicon-based Smart Power Integrated Circuits (ICs).

Figure 1:
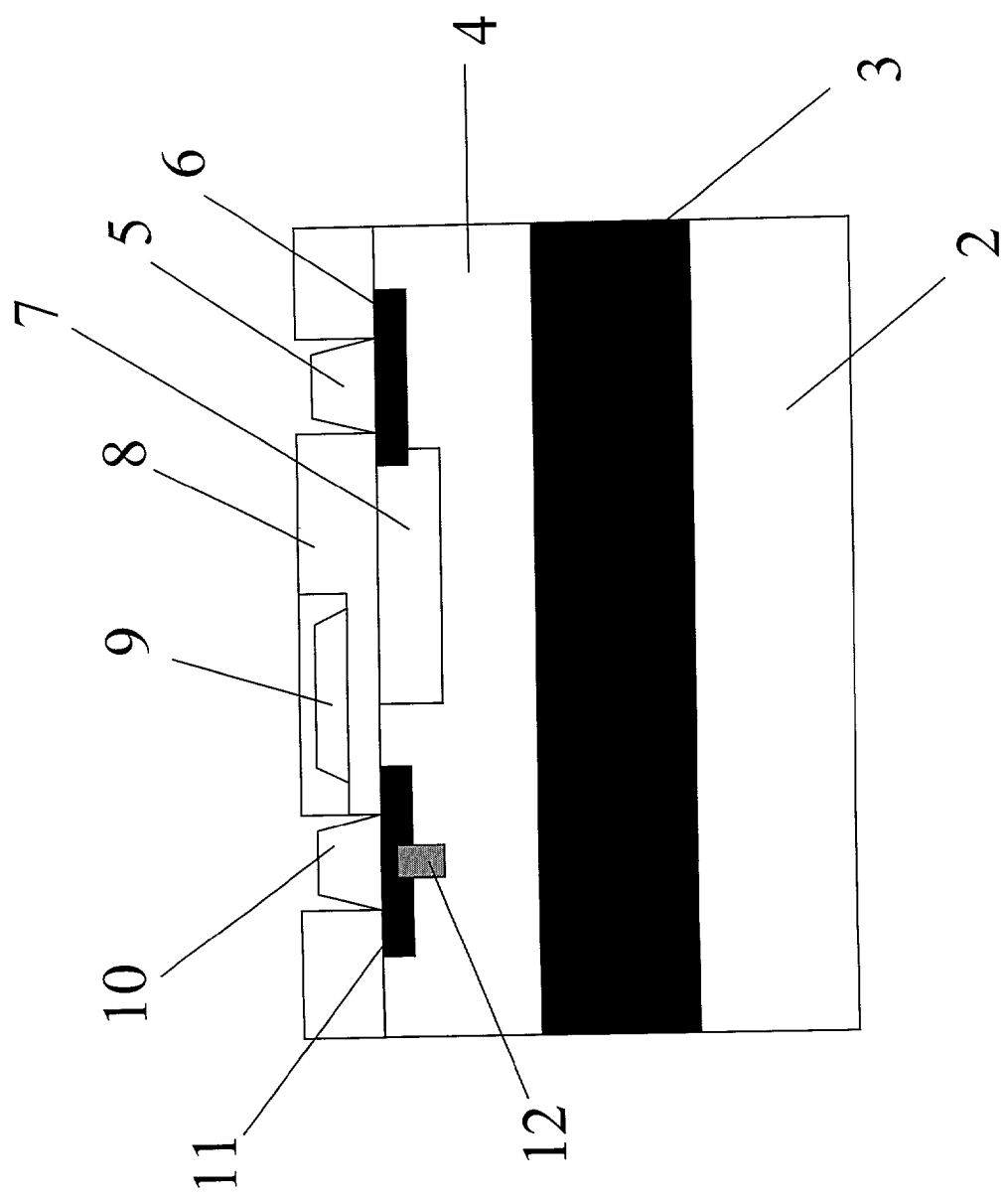
FIG. 1 is a cross-sectional view of a lateral power SiC MOSFET with a semi-insulating epitaxy region in accordance with an embodiment of the present invention.

A cross-section of a single-finger embodiment of the invention is shown in FIG. 1. The example device of the embodiment shown in FIG. 1 is a SiC MOSFET in which all of the device layers are grown epitaxially, while the semi-insulating silicon carbide epitaxial layer is created by one of two methods, which are described in more detail below.

As shown in FIG. 1, the example device 1, such as a lateral power SiC MOSFET, includes a substrate 2 (e.g., $n^+$ 6H silicon carbide), upon which is formed, such as by epitaxially growth, a semi-insulating silicon carbide epitaxial layer 3. In accordance with an embodiment of the present invention, in this example of device formation, a $p^-$ silicon carbide layer 4 is formed on the semi-insulating silicon carbide epitaxial layer 3. The $p^-$ silicon carbide layer includes a graded implant region 7, such as an n-type drift region.

A source/body, including, for example, an $n^+$ source region, with contact area 10, $n^+$ source well 11, and $p^+$ body contact 12, as well as a drain, including, for example, an $n^+$ drain region, with contact area 5, and $n^+$ drain well 6, are formed on the $p^-$ silicon carbide layer 4. A silicon oxide layer 8 is also formed on the $p^-$ silicon carbide layer 4, along with a gate and contact area 9. The device improves breakdown, reduces leakage and assists in device isolation.

In embodiments of the present invention, for the device of FIG. 1, all layers of the MOSFET device are grown epitaxially, and the SI layer 3 is created by one of two methods (referred to herein as Type I or Type II, as described further below).

Figure 2:
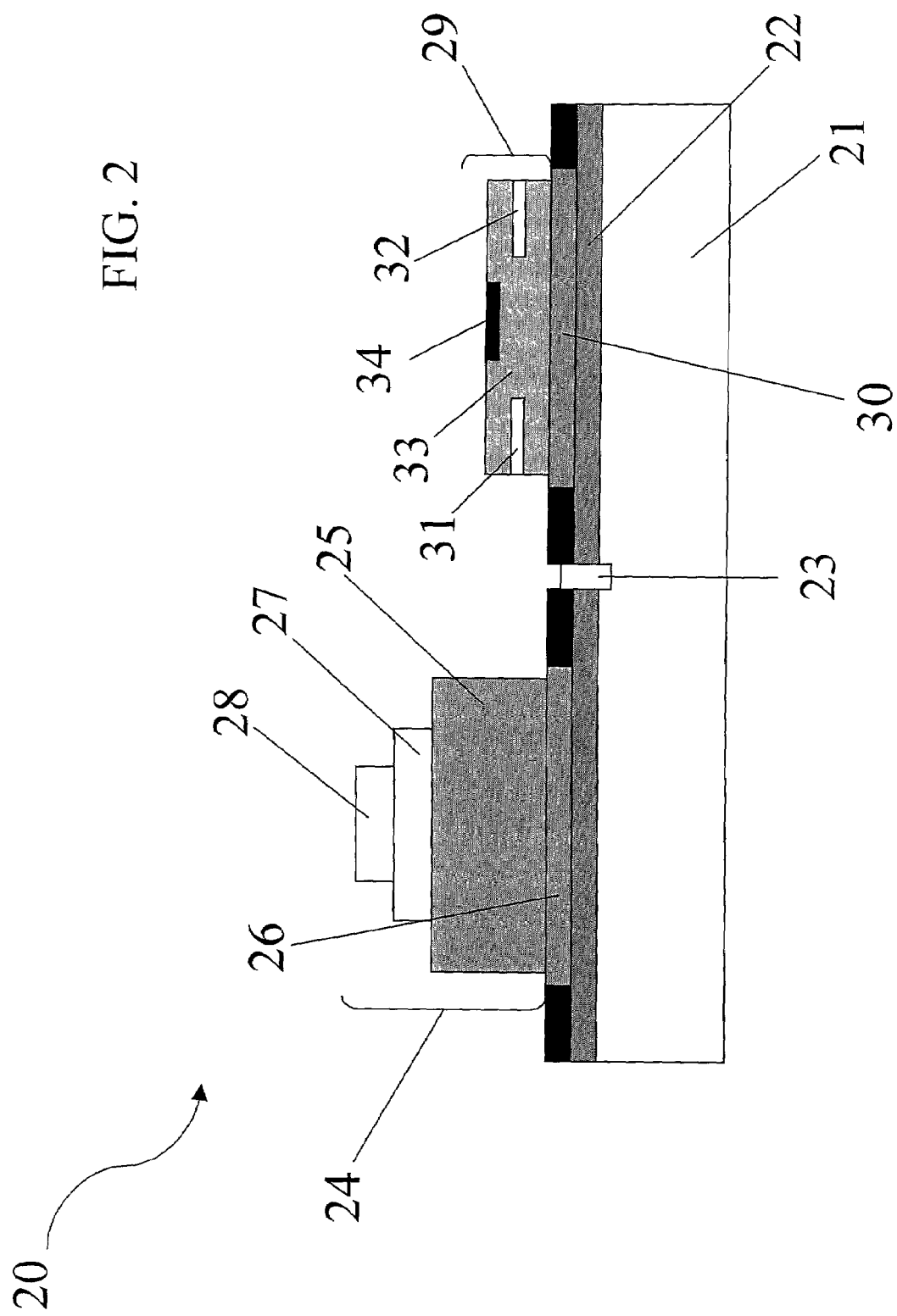
FIG. 2 shows a cross-sectional view of a vertical power bipolar junction transistor (BJT) and a power vertical junction field effect transistor (JFET) on the same SiC chip with electrical isolation from shallow trench isolation (STI) and semi-insulating epitaxy, in accordance with an embodiment of the present invention.

Another group of example devices in accordance with an embodiment of the present invention is illustrated in FIG. 2. FIG. 2 shows two different, electrically isolated vertical power devices 24, 29 on the same SiC chip 20. The power devices 24, 29 in this case are a vertical bipolar junction transistor (BJT) 24 and a vertical junction field effect transistor (JFET) 29.

As shown in FIG. 2, SiC chip 20 includes a substrate 21, such as an $n^+$ substrate, a SI layer 22, such as an epitaxial layer, optional shallow trench isolation (STI) 23, as appropriate, for example, for device formation, to separate the devices 24, 29 (e.g., for electrical isolation), a first semiconductor device 24, such as a BJT, and second semiconductor device 29, such as a vertical JFET. The first device 24, if, for example, a BJT, includes various features, such as an $n^-$ collector 25, an $n^+$ subcollector 26, a $p^-$ base 27, and $n^+$ emitter 28.

The second device 29, if, for example, a vertical JFET, includes various features, such as a source layer 30, such as an $n^+$ layer, gate regions 31, 32, such as $p^+$ layers, and a drain 33, such as an $n^+$ layer, having a contact 34.

Each of the devices 24, 29 of FIG. 2 are intended to be merely illustrative of devices that may be formed on the SI layer 22. With the SI epitaxy, these vertical power devices are capable of being integrated on the same chip as lateral power devices or lateral control circuitry, which forms the basis for a complex, multi-function (e.g., power conditioning, control, amplification) monolithic circuit in SiC, also known as a "Smart Power IC."

A remarkable result of the large bandgap of silicon carbide is the observation of "semi-insulating" 4H substrates with resistivities consistent with insulators at room temperature (i.e., orders of magnitude greater than the maximum of $10^{12}$ Ω-cm typically measurable). Resistivities this high allow a semi-insulating epitaxial layer in SiC to be used as an insulating buffer layer analogous to the buried $SiO_2$ layer in SOI technology. This has tremendous value for high-temperature integrated circuits and high-power discrete and integrated devices for at least two reasons. First, electrical isolation between devices can be achieved while avoiding the low quality and expensive all semi-insulating 4H SiC substrates that are commercially available. Technical performance and affordability are both enhanced by growing a semi-insulating epitaxial layer on a much higher quality and less expensive conducting 4H SiC substrate. Second, high power density integrated circuits can be better achieved using SiC rather than SOI because the semi-insulating SiC epitaxial layer has a much higher thermal conductivity than does the $SiO_2$ used in SOI; therefore, waste heat can be removed far more efficiently. For example, based on the ratio of their thermal conductivities, a SI SiC buffer layer is able to thermally conduct up to 231 times as much heat on a per unit area basis as compared to the typical silicon-dioxide buffer layer used in SOI.

Various methods are possible for growing semi-insulating silicon carbide epitaxial films, in accordance with embodiments of the present invention. One method, which is referred to herein as "Type I," includes use of the boron related D-center to compensate shallow nitrogen donors during growth of SiC epitaxial layers (the D-center, approximately 0.7 eV above the valence band in SiC, has been detected in all polytypes of SiC studied, and hence this method will work for all epitaxially grown SiC). The boron related D-center, also known as a "point defect," is related to the boron atom occupying a silicon substitution site in the silicon carbide crystal. This phenomenon, as well as processes known in the art for forming epitaxial films exhibiting these characteristics, are described further in Michael Mazzola, et al., "Observation of the D-Center in 6H SIC p-n Diodes Grown by Chemical Vapor Deposition," *Appl. Phys. Ltrs.*, 64:2730–2732 (May 16, 1994), which is hereby incorporated by reference. In general, characteristics of the semi-insulating silicon carbide layer, including enhancement of occurrence of site competition epitaxy, can be varied by varying the relative concentration of the silicon and carbon used to form the layer, while the compensating material, such as boron, is supplied.

A second method, referred to herein as "Type II," includes use of a semi-insulating epitaxial layer compensated with a suitable transition metal. The dopant source for the transition metal may be a solid source, an organometallic liquid, or a non-organic gas. Suitable solid sources include, but are not limited to boron nitride and diborane (for Type I) and vanadium nitride or vanadium carbide (for Type II) (see, e.g., Y. Koshka, et al., "Vanadium Doping of 4H SiC from a Solid Source: Photoluminescence Investigation," *J. Electron. Mater.*, 30:220–223 (2001), which is hereby incorporated by reference). Other boron sources are usable with the present invention. Other candidate impurities include germanium, which produces an attractive $E_c$–1.2 eV deep level (see, e.g., A. Uddin and T. Uemoto, "Trap centers in germanium-implanted and in as-grown 6H-SiC," *Jpn. J. Appl. Phys.*, 34:3023–3029 (1995), which is hereby incorporated by reference), and chromium, which produces shallower deep levels (see, e.g., N. Achtziger et al., "Band Gap States of V and Cr in 6H-silicon carbide," *Appl. Phys. A*, 65:329–331 (1997), which is hereby incorporated by reference).

As is known with GaAs:Cr semi-insulators (see, e.g., G. Cronin and R. Haisty, "The preparation of semi-insulating gallium arsenide by chromium doping," *J. Electrochem. Soc.*, 111:874–877 (1964), which is hereby incorporated by reference), when the compensating impurity produces only deep levels, all that is required for close compensation is a threshold concentration of the compensating impurity such that $N_T > |N_D - N_A|$, because the thermal ionization of the excess deep level concentration at typical device operating temperatures is negligible. A Type II semi-insulator requires less stringent doping control of the compensating agent than a Type I semi-insulator because a Type I compensating impurity (such as boron in SiC) forms both shallow and deep levels.

One application of a Type I D-center compensated semi-insulator, in accordance with embodiments of the present invention, is as a high-purity buffer layer between radio frequency (RF) and microwave frequency transistors and underlying semi-insulating substrates or conducting substrates with Type II semi-insulating isolation epitaxial layers. This application is useful, for example, because undesirable back-gating effects are associated with SiC semi-insulators compensated with Type II impurities.

One application of a Type II semi-insulator, in accordance with embodiments of the present invention, is as a thin isolation layer analogous to the buried silicon dioxide layer in SOI. Unlike the $SiO_2$ layer in SOI, however, the SiC semi-insulator of this embodiment is of the same material as the substrate and any overlying conducting epitaxial layers that may be grown on the Type II semi-insulator. Unlike SOI, with this application, there are little or no material compatibility problems while homoepitaxially growing conducting device layers on the SiC semi-insulating isolation layer. Specifically, lattice constant and coefficients of thermal expansion are identical between the conducting substrate, the SI epitaxial layer and the conducting epitaxial layers in which the device is fabricated, producing superior properties than are available with SOI.

The present invention has several advantages over the prior art. The use of SI layers allows for the use of less expensive, conducting SiC substrates, while retaining device performance advantages gained from the SI layer. SI layers isolate active areas of devices, such as high-frequency metal-semiconductor field effect transistors (MESFETs), from the substrate, either conducting or SI substrate, thereby providing for a less defective and higher performance active device. The present invention is also capable of improving reliability in MESFET and other devices by reducing back-gating effects. Additionally, the present invention offers electrically insulating, but thermally conductive, layers, which have the capability of reducing device leakage, increasing performance, and providing isolation of devices, which allow for higher levels of integration.

The different polytypes of silicon carbide (e.g., 6H SiC and 4H SiC) can produce different characteristics in the device, thus providing differing advantages and preferred uses. One difference between 6H SiC and 4H SiC, for example, is the bandgap of these polytypes: the bandgap of 6H SiC is about 2.9 eV, while that of 4H SiC is about 3.2 eV. The 0.3 eV difference between these polytypes makes each typically suitable for different applications. For example, 4H SiC is often preferable for high voltage or high power applications, to take advantage of the larger bandgap, while 6H SiC is preferable, for example, for use in some applications because of its common commercial use in light emitting diodes. The present invention has been observed to work well in all SiC polytypes.

The present invention is usable for application directly to compact, solid-state television and radar transmitters operating from very high frequency (VHF) to above X-band (10 GHz). The present invention is also usable for military applications, and, in particular, airborne radar systems on advanced military aircraft. Commercial applications include television transmitter stations, cellular telephone base stations, and satellite communication links for telephony, audio, and image transmission. Also, efficient power switching utilizing compact direct current to direct current (DC—DC) converters and motor drive control circuitry can take advantage of the present invention in, for example, hybrid-electric vehicles and fluorescent lighting ballasts.

Figure 3:
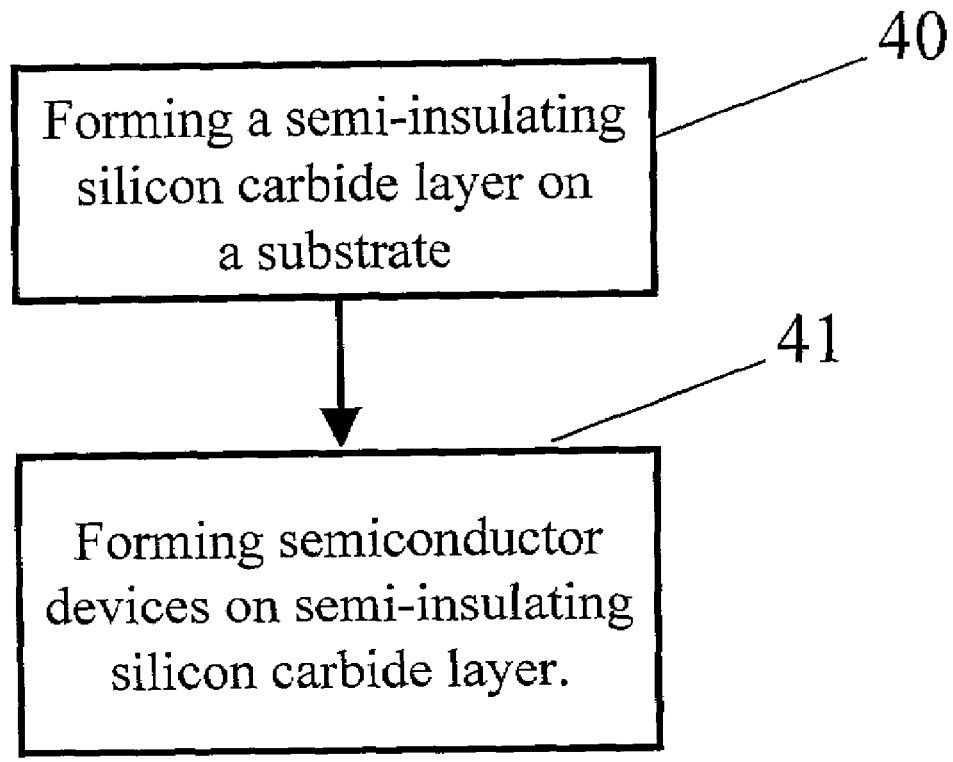
FIG. 3 presents a flowchart of a method for forming a microelectronic device having a semi-insulating silicon carbide layer, in accordance with an embodiment of the present invention.

FIG. 3 presents a flowchart of a method for forming a microelectronic device having a semi-insulating silicon carbide layer, in accordance with an embodiment of the present invention. As shown in FIG. 3, a semi-insulating silicon carbide layer is formed on a substrate 40. One or more semiconductors are then formed on the semi-insulating silicon carbide layer 41.

Example embodiments of the present invention have now been described in accordance with the above advantages. It will be appreciated that these examples are merely illustrative of the invention. Many variations and modifications will be apparent to those skilled in the art.

What is claimed is:

1. A microelectronic device, comprising:
    a substrate;
    a single semi-insulating silicon carbide layer formed on the substrate, the semi-insulating silicon carbide layer comprising boron and a shallow donor impurity, the semi-insulating silicon carbide layer having boron-related D-center defects formed therein; and
    a first semiconductor device formed on the semi-insulating silicon carbide layer, the first semi-conductor device having an active area comprising a high bandgap material.

2. The device of claim 1, wherein the semi-insulating silicon carbide layer is formed epitaxially.

3. The device of claim 2, wherein the first semiconductor device is a high frequency, device.

4. The device of claim 2, wherein the first semiconductor device is a high power device.

5. The device of claim 1, wherein the substrate is a conductor.

6. The device of claim 1, wherein the substrate comprises $n^+$ silicon carbide.

7. The device of claim 1, wherein the semi-insulating silicon carbide layer comprises 6H silicon carbide.

8. The device of claim 1, wherein the semi-insulating silicon carbide layer comprises 4H silicon carbide.

9. The device of claim 1, wherein the active area of the first semiconductor device comprises silicon carbide.

10. The device of claim 1, wherein the first semiconductor device comprises a metal-oxide-semiconductor field effect transistor.

11. The device of claim 1, wherein the first semiconductor device comprises a lateral metal-oxide-semiconductor field effect transistor.

12. The device of claim 1, wherein the first semiconductor device comprises a bipolar junction transistor.

13. The device of claim 1, wherein the first semiconductor device comprises a junction field effect transistor.

14. The device of claim 1, further comprising:
at least a second semiconductor device.

15. The device of claim 14, wherein the at least a second semiconductor device is found on a portion of the substrate that is physically isolated from the first semiconductor device.

16. The device of claim 14, wherein the at least a second semiconductor device is found on a portion of the substrate that is electrically isolated from the first semiconductor device.

17. The device of claim 1, wherein die first semiconductor device is formed epitaxially.

18. An integrated circuit device comprising:
a conducting substrate;
a first single semi-insulating silicon carbide layer formed over a first portion of the conducting substrate, the first single semi-insulating silicon carbide layer comprising boron and a shallow donor impurity, the first single semi-insulating silicon carbide layer having boron-related D-center defects formed therein;
a first device formed over at least part of the first portion of the substrate; and
a second device fanned over a second portion at the substrate different from the first portion,
wherein the first device is electrically isolated from the second device.

19. The integrated circuit device of claim 18, wherein the first device is formed over at least part of the first semi-insulating silicon carbide layer.

20. The integrated circuit device of claim 18, wherein the first device is a high power device.

21. The integrated circuit device of claim 20, wherein the second device is a control device.

22. The integrated circuit device of claim 18, wherein the first device is a high frequency device.

23. The integrated circuit device of claim 22, wherein the second device is a control device.

24. The integrated circuit device of claim 19, wherein the first device is a lateral device.

25. The integrated circuit device of claim 19, wherein the second device is a control device.

26. The integrated circuit device of claim 19, wherein the second device is a vertical device.

27. The microelectronic device of claim 1, wherein the shallow donor impurity is nitrogen.

28. The microelectronic device of claim 1, wherein the semi-insulating silicon carbide layer is formed by epitaxial growth.

29. The microelectronic device of claim 28, wherein the shallow donor impurity is nitrogen, and wherein the semi-insulating silicon carbide layer is co-doped with boron and nitrogen during epitaxial growth.

30. The integrated circuit device of claim 18, wherein the shallow donor impurity is nitrogen.

31. The integrated circuit device of claim 18, wherein the semi-insulating silicon carbide layer is formed by epitaxial growth.

32. The integrated circuit device of claim 31, wherein the shallow donor impurity is nitrogen, and wherein the semi-insulating silicon carbide layer is co-doped with boron and nitrogen during epitaxial growth.

33. The integrated circuit device of claim 26, further comprising a second single semi-insulating silicon carbide layer comprising boron and a shallow donor impurity, the second single semi-insulating silicon carbide layer having boron-related D-center defects formed therein;
wherein the second single semi-insulating silicon carbide layer is formed between the vertical device and the second portion of the conducting substrate, and is electrically isolated from the first semi-insulating silicon carbide layer.

34. The integrated circuit device of claim 18, further comprising a second single semi-insulating silicon carbide layer comprising boron and a shallow donor impurity, the second single semi-insulating silicon carbide layer having boron-related D-center defects formed therein;
wherein the second single semi-insulating silicon carbide layer is formed between the second device and the second portion of the conducting substrate and is electrically isolated from the first semi-insulating silicon carbide layer.

* * * * *